(12) United States Patent
Takeuchi et al.

(10) Patent No.: US 9,673,288 B2
(45) Date of Patent: Jun. 6, 2017

(54) SILICON CARBIDE SEMICONDUCTOR DEVICE INCLUDING CONDUCTIVITY LAYER IN TRENCH

(71) Applicants: DENSO CORPORATION, Kariya, Aichi-pref. (JP); Kazumi Chida, Toyota-shi, Aichi-ken (JP)

(72) Inventors: Yuichi Takeuchi, Obu (JP); Kazumi Chida, Nissin (JP); Narumasa Soejima, Seto (JP); Yukihiko Watanabe, Nagoya (JP)

(73) Assignees: DENSO CORPORATION, Kariya (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 14/387,425

(22) PCT Filed: Apr. 17, 2013

(86) PCT No.: PCT/JP2013/002594
§ 371 (c)(1),
(2) Date: Sep. 23, 2014

(87) PCT Pub. No.: WO2013/157259
PCT Pub. Date: Oct. 24, 2013

(65) Prior Publication Data
US 2015/0048382 A1 Feb. 19, 2015

(30) Foreign Application Priority Data

Apr. 19, 2012 (JP) .................................. 2012-95517

(51) Int. Cl.
*H01L 29/15* (2006.01)
*H01L 31/0312* (2006.01)
(Continued)

(52) U.S. Cl.
CPC ........ *H01L 29/4236* (2013.01); *H01L 21/044* (2013.01); *H01L 21/0465* (2013.01);
(Continued)

(58) Field of Classification Search
CPC ....................... H01L 29/4236; H01L 29/1608
(Continued)

(56) References Cited

U.S. PATENT DOCUMENTS 6,031,265 A 2/2000 Hshieh
6,342,709 B1 * 1/2002 Sugawara ........... H01L 29/0619
257/138

(Continued)

FOREIGN PATENT DOCUMENTS

JP H11-233391 A 8/1999
JP 2001-267570 A 9/2001
(Continued)

OTHER PUBLICATIONS

International Search Report of the International Searching Authority mailed Jul. 30, 2013 in the corresponding PCT application No. PCT/JP2013/002594 (and English translation).

(Continued)

*Primary Examiner* — Robert Huber
(74) *Attorney, Agent, or Firm* — Posz Law Group, PLC (57) ABSTRACT

In a silicon carbide semiconductor device, a p-type SiC layer is disposed in a corner of a bottom of a trench. Thus, even if an electric field is applied between a drain and a gate when a MOSFET is turned off, a depletion layer in a pn junction between the p-type SiC layer and an n⁻ type drift layer greatly extends toward the n⁻ type drift layer, and a high voltage caused by an influence of a drain voltage hardly enters a gate insulating film. Hence, an electric field concentration within the gate insulating film can be reduced, and the gate insulating film can be restricted from being broken.

(Continued)

In this case, although the p-type SiC layer may be in a floating state, the p-type SiC layer is formed in only the corner of the bottom of the trench. Thus, the deterioration of the switching characteristic is relatively low.

10 Claims, 5 Drawing Sheets

(51) Int. Cl.
| | |
|---|---|
| H01L 29/423 | (2006.01) |
| H01L 29/66 | (2006.01) |
| H01L 29/78 | (2006.01) |
| H01L 29/06 | (2006.01) |
| H01L 29/16 | (2006.01) |
| H01L 21/3065 | (2006.01) |
| H01L 21/265 | (2006.01) |
| H01L 21/324 | (2006.01) |
| H01L 29/10 | (2006.01) |
| H01L 21/04 | (2006.01) |

(52) U.S. Cl.
CPC .... *H01L 21/26513* (2013.01); *H01L 21/3065* (2013.01); *H01L 21/324* (2013.01); *H01L 29/0623* (2013.01); *H01L 29/1095* (2013.01); *H01L 29/1608* (2013.01); *H01L 29/66068* (2013.01); *H01L 29/66734* (2013.01); *H01L 29/7813* (2013.01); *H01L 29/42368* (2013.01)

(58) Field of Classification Search
USPC .......................................... 257/77, E29.104
See application file for complete search history.

(56) References Cited

U.S. PATENT DOCUMENTS

| | | |
|---|---|---|
| 2005/0233539 A1 | 10/2005 | Takeuchi et al. |
| 2006/0289928 A1 | 12/2006 | Takaya et al. |
| 2007/0015333 A1 | 1/2007 | Kishimoto et al. |
| 2008/0038890 A1 | 2/2008 | Tucker |
| 2009/0114923 A1 | 5/2009 | Iwamuro |
| 2009/0289264 A1* | 11/2009 | Matsuki .............. H01L 21/0465 257/77 |
| 2010/0006861 A1 | 1/2010 | Yamamoto et al. |
| 2010/0019250 A1 | 1/2010 | Nakamura et al. |
| 2010/0224932 A1 | 9/2010 | Takaya et al. |
| 2011/0254010 A1* | 10/2011 | Zhang ................ H01L 29/0623 257/66 |
| 2012/0052642 A1 | 3/2012 | Endo et al. |
| 2015/0129895 A1 | 5/2015 | Takeuchi et al. |

FOREIGN PATENT DOCUMENTS

| | | |
|---|---|---|
| JP | 2003-031802 A | 1/2003 |
| JP | 2006-032420 A | 2/2006 |
| JP | 2009-081412 A | 4/2009 |
| JP | 2012-004312 A | 1/2012 |

OTHER PUBLICATIONS

Written Opinion of the International Searching Authority mailed Jul. 30, 2013 in the corresponding PCT application No. PCT/JP2013/002594 (and English translation).
Corrected Notice of Allowability dated Apr. 18, 2016 in a related U.S. Appl. No. 14/402,119.
Supplemental Corrected Notice of Allowability dated Apr. 22, 2016 in a related U.S. Appl. No. 14/402,119.
Office Action mailed May 9, 2016 issued in the corresponding U.S. Appl. No. 15/001,726.
ISR and Written Opinion mailed Aug. 27, 2013 in the related PCT application No. PCT/JP2013/003547.
Office Action mailed on Jun. 22, 2015 in the related U.S. Appl. No. 14/402,119.
Office Action mailed on Sep. 16, 2015 in the related U.S. Appl. No. 14/402,119.
Korean Office Action dated Nov. 10, 2015 in the related Korean application No. 10-2014-7034621. ( English translation attached).
Extended European Search Report dated Feb. 10, 2016 in the related EP application No. 138043963.
U.S. Appl. No. 15/001,726, filed Jan 20, 2016, Takeuchi et al.
Corrected Notice of Allowance issued Mar. 31, 2016 in corresponding U.S. Appl. No. 14/402,119.
Notice of Allowance issued Aug. 15, 2016 in corresponding U.S. Appl. No. 15/001,726.

* cited by examiner

RELATED ART

SILICON CARBIDE SEMICONDUCTOR DEVICE INCLUDING CONDUCTIVITY LAYER IN TRENCH

CROSS-REFERENCE TO RELATED APPLICATIONS

The present disclosure is a U.S. national stage application of International Patent Application No. PCT/JP2013/002594 filed on Apr. 17, 2013 and is based on Japanese Patent Application No. 2012-95517 filed on Apr. 19, 2012, the contents of which are incorporated herein by reference.

TECHNICAL FIELD

The present disclosure relates to a silicon carbide (hereinafter referred to as "SiC") semiconductor device having a semiconductor switching element with a trench gate structure, and a method of manufacturing the same.

BACKGROUND

In the semiconductor device having the semiconductor switching element, an increase in channel density is effective in allowing a larger current to flow. In a silicon transistor, in order to increase the channel density, a MOSFET having a trench gate structure is employed, and put into practical use. The trench gate structure can be also applied to an SiC semiconductor device. However, when the trench gate structure is applied to SiC, because SiC is 10 times in breakdown field strength as large as that of silicon, a voltage nearly 10 times as high as that of a silicon device is applied to the SiC semiconductor device in use. For that reason, an electric field of the strength ten times as large as that of the silicon device is applied to a gate insulating film formed within the trench. As a result, the gate insulating film may be easily broken at the corners of the trench.

In order to solve the above problem, patent literature 1 proposes a structure in which a p-type impurity is ion-implanted to a part lower than a bottom (bottom surface) of the trench configuring the trench gate structure to form a p-type layer. With the formation of the above p-type layer, an electric field concentration at the bottom of the trench can be reduced, thereby being capable of restricting the gate insulating film from being broken.

Also, when the corners of the trench configuring the trench gate structure are angular, the electric field concentration is more generated, leading to a reduction in the lifetime of the gate insulating film. For that reason, patent literature 2 proposes to perform a rounding process for rounding the corners of the trench by conducting hydrogen etching. Because the corners of the trench can be thus rounded to inhibit the gate insulting film from being partially thinned, the breakage of the gate insulating film at the time of turning on and off the MOSFET can be restricted.

PRIOR ART LITERATURES

Patent Literatures

Figure 5:
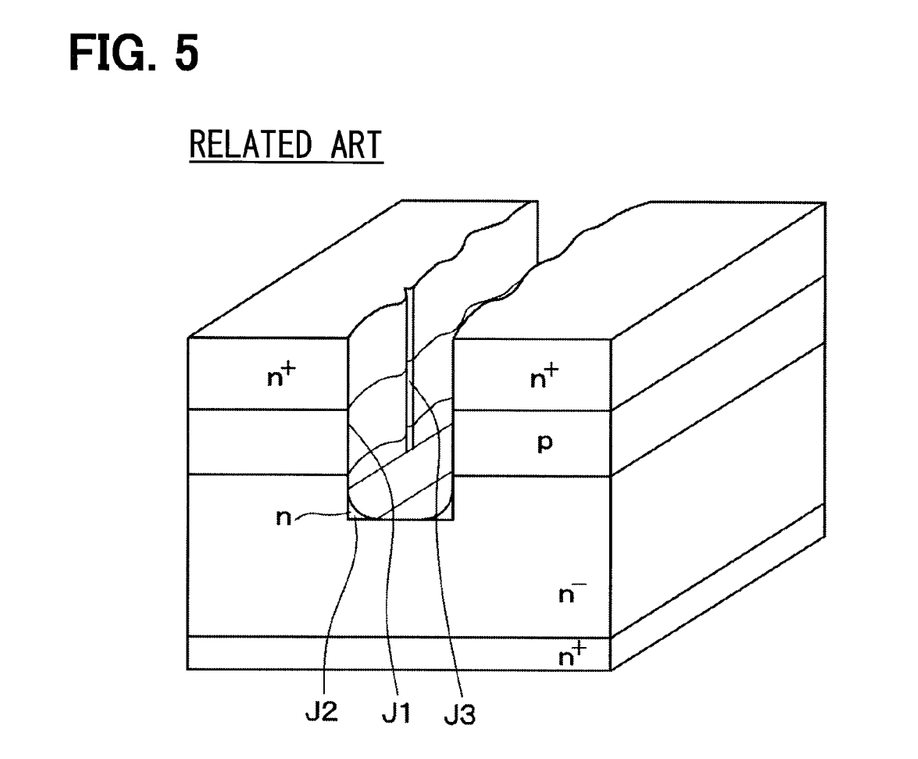
FIG. 5 is a perspective cross-sectional view illustrating a state in which hydrogen etching is conducted after trench etching in a process of manufacturing a MOSFET in a related art.

Patent Literature 1: JP-A-2007-242852 (corresponding to U.S. Patent Application Publication No. 20100224932 A1)
Patent Literature 2: JP-A-2005-328014 (corresponding to U.S. Patent Application Publication No. 20050233539 A1)
However, in the structure disclosed in the patent literature 1, the p-type layer is formed in an extensive area such as the overall bottom of the trench, and the p-type layer is put into a floating state. Therefore, the switching characteristic is deteriorated. Also, when the hydrogen etching is conducted as in the patent literature 2, it is confirmed that an n-type layer J2 is formed at each corner of the bottom of the trench J1, as illustrated in FIG. 5. The electric field is concentrated on the gate insulating film at the time of turning off a MOSFET, thereby leading to a reduction of the lifetime of the gate insulating film. Further, as illustrated in FIG. 5, it is confirmed that there is a case where an n-type layer J3 is formed on a side surface of the trench J1 at the time of hydrogen etching. The n-type layer J3 forms a channel path, and increases a drain leakage current at the time of turning off the MOSFET. A mechanism in which those n-type layers J2 and J3 are formed is not apparent, but it is considered because the etched gas again adheres to a trench inner wall surface to form an SiC layer, and nitrogen remaining within a reactive furnace, which is used for etching, is taken in the SiC layer as the n-type impurity. The n-type impurity concentration of those n-type layers J2 and J3 is $1 \times 10^{16}$ to $1 \times 10^{17}$ cm$^{-3}$, which is a concentration of the degree that is sufficiently converted into n-type, and therefore the above phenomenon is created.

SUMMARY

In view of the above circumstances, the present disclosure aims at providing an SiC semiconductor device with a structure that can further restrict the gate insulating film from being broken, and can reduce deterioration of the switching characteristic, and a method of manufacturing the same.

According to an aspect of the present disclosure, there is provided an SiC semiconductor device having a semiconductor switching element with an inversion type trench gate structure which forms an inversion type channel region in a surface portion of a base region located on the side surface of a trench by controlling an application voltage to a gate electrode, and allows a current to flow between a source electrode and a drain electrode through a source region and a drift layer. In the SiC semiconductor device, a second conductivity type layer which has a round triangular shape in cross-section taken along a depth direction of the trench, and is made of a second conductivity type SiC is disposed in a corner of the bottom of the trench.

Thus, the second conductivity type layer is formed in the corner of the bottom of the trench. For that reason, even if an electric field is applied between a drain and a gate when the semiconductor switching element is turned off, a depletion layer in a pn junction between the second conductivity type layer and the drift layer greatly extends toward the drift layer side. As a result, a high voltage caused by an influence of the drain voltage hardly enters the gate insulating film. With the above configuration, an electric field concentration within the gate insulating film, in particular, the electric field concentration in the bottom of the trench in the gate insulating film can be reduced, thereby being capable of restricting the gate insulating film from being broken.

In the semiconductor switching element with the above trench gate structure, the second conductivity type layer may be in a floating state. However, since the second conductivity type layer is formed in only the corner of the bottom of the trench, a formation area is narrow as compared with the structure in which the second conductivity type layer is formed on the overall bottom of the trench having a predetermined width of a bottom. For that reason, the deterioration of the switching characteristic is relatively low, and the deterioration of the switching characteristic can be suppressed. For example, when a coupling layer is formed on the side surface of the trench, the second conductivity type layer becomes the same potential as that of the base region through the coupling layer. For that reason, the second conductivity type layer can be prevented from being made in the floating state, and the deterioration of the switching characteristic can be further suppressed.

The above SiC semiconductor device is manufactured in a manufacturing method including a trench etching step of forming the trench to a position deeper than the base region from a surface of the source region; and a step of, after the trench etching step, conducting a heat treatment under a hydrogen atmosphere mixed with a second conductivity type dopant gas to subject the inner wall surface of the trench to hydrogen etching, and to form the second conductivity type layer in the corner of the bottom of the trench by epitaxial growth taking a second conductivity type dopant gas.

Since the hydrogen etching is implemented by the heat treatment under the high temperature hydrogen atmosphere, damage caused by the trench etching is removed, and a rounding process is conducted so that the corners of the bottom of the trench can be rounded. In this situation, the etching gas again adheres to the inner wall surface of the trench so that the second conductivity type layer epitaxially grows. With the above process, the SiC semiconductor device can be manufactured.

BRIEF DESCRIPTION OF DRAWINGS

The above and other objects, features, and advantages of the present disclosure will become apparent from the following detailed description with reference to the attached drawings. In the drawings:

FIG. 2(a) to (e) of FIG. 2 are perspective cross-sectional views illustrating a process of manufacturing the MOSFET having the trench gate structure illustrated in FIG. 1;

FIG. 4(a) to (e) of FIG. 4 are perspective cross-sectional views illustrating a process of manufacturing the MOSFET having the trench gate structure illustrated in FIG. 3.

DESCRIPTION OF EMBODIMENTS

Hereinafter, embodiments of the present disclosure will be described with reference to the drawings. In the following respective embodiments, parts identical with or equivalent to each other are denoted by the same symbols for description.

First Embodiment

A first embodiment of the present disclosure will be described. In the description, a semiconductor switching element having a trench gate structure will be exemplified by an SiC semiconductor device in which an inversion type MOSFET is formed.

Figure 1:
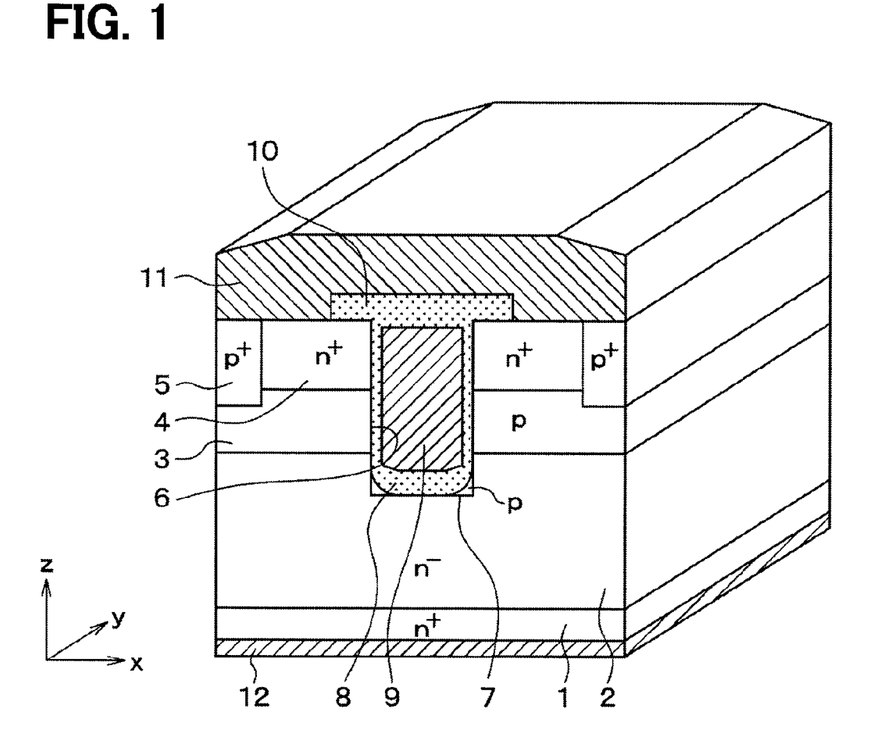
FIG. 1 is a perspective cross-sectional view illustrating one cell extracted from a MOSFET having a trench gate structure according to a first embodiment of the present disclosure.

As illustrated in FIG. 1, an inversion type MOSFET of an n-channel type is formed in the SiC semiconductor device. MOSFETs having the same structure as that of the MOSFET illustrated in the figure are arranged in plural rows adjacent to each other to configure the MOSFETs of plural cells. Specifically, a semiconductor substrate is formed of an $n^+$ type substrate 1 made of SiC, and the respective components of the MOSFET is formed over the $n^+$ type substrate 1 to configure the MOSFET.

The $n^+$ type substrate 1 is, for example, $1.0 \times 10^{19}/cm^3$ in n-type impurity concentration such as nitrogen, and about 300 μm in thickness. An $n^-$ type drift layer 2 made of SiC which is, for example, $3.0 \times 10^{15}$ to $2.0 \times 10^{16}/cm^3$ in n-type impurity concentration such as nitrogen, and about 10 to 15 μm in thickness is formed on a surface of the $n^+$ type substrate 1. The impurity concentration of the $n^-$ type drift layer 2 may be kept constant in a depth direction thereof, but a concentration distribution can be inclined so that the concentration of the $n^-$ type drift layer 2 is higher on a side adjacent to the $n^+$ type substrate 1 than a side far from the $n^+$ type substrate 1. With the above configuration, because an internal resistance of the $n^-$ type drift layer 2 can be reduced, an on-resistance can be reduced.

A p-type base region 3 is formed on a surface layer portion of the n– type drift layer 2, and an $n^+$ type source region 4 and $p^+$ type contact layers 5 are formed on an upper layer portion of the p-type base region 3.

The p-type base region 3 is, for example, $1.0 \times 10^{16}$ to $2.0 \times 10^{19}/cm^3$ in p-type impurity concentration such as boron or aluminum, and about 2.0 μm in thickness. The $n^+$ type source region 4 is, for example, $1.0 \times 10^{21}/cm^3$ in n-type impurity concentration such as nitrogen in the surface layer portion, and about 0.3 μm in thickness. Each of the $p^+$ type contact layers 5 is, for example, $1.0 \times 10^{21}/cm^3$ in p-type impurity concentration (surface concentration) such as boron or aluminum in the surface layer portion, and about 0.3 μm in thickness. The $n^+$ source region 4 is arranged on both sides of a trench gate structure, which will be described later, and the $p^+$ type contact layer 5 is disposed on a side of the $n^+$ type source region 4 opposite to the trench gate structure.

Also, a structure that penetrates through the p-type base region 3 and the $n^+$ type source region 4, reaches the $n^-$ type drift layer 2, and has a bottom of a given width, for example, a trench 6 that is 0.5 to 2.0 μm in width and 2.0 μm or higher (for example, 2.4 μm) in depth is formed. The p-type base region 3 and the $n^+$ type source region 4 described above are arranged in contact with the side surface of the trench 6.

The trench 6 is formed in such a manner that an x-direction in FIG. 1 corresponds to a width direction, a y-direction corresponds to a longitudinal direction, and a z-direction corresponds to a depth direction, and a plurality of the trenches 6 is arrayed in the x-direction in FIG. 1 into a stripe shape in which the respective trenches 6 are arrayed in parallel to each other. The corners of the bottom of the trench 6 are rounded by a rounding process. A p-type SiC layer 7 is formed at a position of each rounded corner of the bottom of the trench 6.

The p-type SiC layer 7 is formed in only each corner of the bottom of the trench 6, and a cross-sectional shape of the p-type SiC layer 7 taken along a depth direction of the trench 6 is a triangular round shape (triangular shape having a round side). That is, the cross-sectional shape of the p-type SiC layer 7 is a triangular shape having two sides that contact with the side surface and the bottom of the trench 6, and one side that contacts with a gate insulating film 8 which will be described later within the trench 6. The one side that contacts with the gate insulating film 8 is rounded. Also, a p-type impurity concentration of the p-type SiC layer 7 is set to $1\times10^{17}/cm^3$ or higher. The p-type SiC layer 7 also includes an n-type impurity, but because the p-type impurity concentration is higher than the n-type impurity concentration, the SiC layer 7 is compensated into the p-type.

The p-type SiC layers 7 are formed in the respective corners of the bottom of the trench 6, and spaced away from each other in the width direction of the trench 6 except for both ends of the trench 6. For that reason, in the bottom of the trench 6, the n⁻ drift layer 2 is not covered with the p-type SiC layer 7, and is exposed. Also, the p-type SiC layers 7 are spaced away from the p-type base region 3, and the n⁻ type drift layer 2 is interposed between the p-type SiC layer 7 and the p-type base region 3, and exposed from the side surface of the trench 6.

Although not illustrated in FIG. 1, a p-type SiC layer 13 (FIG. 2(d)) may also be partially formed on the side surface of the trench 6 as will be described later. In that case, the p-type SiC layer 7 is fixed to the same potential as that of the p-type base region 3. However, if the p-type SiC layer 13 is not formed, the p-type SiC layer 7 becomes in a floating state.

Further, the inner wall surface of the trench 6 is covered with the gate insulating film 8 formed of an oxide film, and the interior of the trench 6 is embedded with a gate electrode 9 which is formed on a surface of the gate insulating film 8, and made of doped Poly-Si. The gate insulating film 8 is formed by thermally oxidizing the inner wall surface of the trench 6, and a thickness of the gate insulating film 8 is about 100 nm in both sides of the side surface and the bottom of the trench 6. The trench gate structure is configured as described above.

A source electrode 11 and a gate wiring (not shown) are formed over the n⁺ type source region 4, and a surface of the p⁺ type contact layers 5, and a surface of the gate electrode 9 through an interlayer insulating film 10. The source electrode 11 and the gate wiring are made of plural metals (for example, Ni/Al), and a part of the source electrode 11 and the gate wiring which contact with n-type SiC (specifically, the n⁺ type source region 4 or the n-doped gate electrode 9) is at least made of metal that can come in ohmic contact with the n-type SiC. A part of the source electrode 11 and the gate wiring which contact with p-type SiC (specifically, the p⁺ type contact layer 5 or the p-doped gate electrode 9) is at least made of metal that can come in ohmic contact with the p-type SiC. The source electrode 11 and the gate wiring are formed on the interlayer insulating film 10 so as to be electrically isolated. The source electrode 11 comes in electric contact with the n⁺ type source region 4 and the p⁺ type contact layer 5 and the gate wiring comes in electric contact with the gate electrode 9, through contact holes formed in the interlayer insulating film 10.

A drain electrode 12 electrically connected to the n⁺ type substrate 1 is formed on a rear side of the n⁺ type substrate 1. With the above structure, the MOSFET having the inversion type trench gate structure of the n-channel type is configured.

The MOSFET with the above inversion type trench gate structure operates as follows. First, in a state where a gate voltage is applied to the gate electrode 9, no inversion layer is formed in the p-type base region 3. Therefore, even if a positive voltage is applied to the drain electrode 12, electrons cannot reach the p-type base region 3 from the n type source region 4, and no current flows between the source electrode 11 and the drain electrode 12.

Next, in an off-state (gate voltage=0V, drain voltage=650V, source voltage=0V), even if a voltage is applied to the drain electrode 12, a reverse bias is generated. Therefore, a depletion layer spreads from between the p-type base region 3 and the n⁻ type drift layer 2. In this situation, since a concentration of the p-type base region 3 is higher than that of the n⁻ type drift layer 2, most of the depletion layer spreads toward the n⁻ type drift layer 2. Because the depletion layer spreads more than that when drain voltage is 0V, a region serving as an insulator further expands. As a result, no current flows between the source electrode 11 and the drain electrode 12.

Also, because the gate voltage is 0V, an electric field is also applied between the drain and the gate. For that reason, an electric field can be also concentrated on the bottom of the gate insulating film 8. However, because the p-type SiC layers 7 are formed on the bottom of the trench 6, the depletion layer in the pn junction between the p-type SiC layer 7 and the n⁻ type drift layer 2 greatly extends toward the n⁻ type drift layer 2, and the high voltage caused by an influence of the drain voltage hardly enters the gate insulating film 8. With the above configuration, the electric field concentration within the gate insulating film 8, in particular, the electric field concentration in the bottom of the trench 6 in the gate insulating film 8 can be reduced, thereby being capable of restricting the gate insulating film 8 from being broken.

On the other hand, in an on-state (gate voltage=20V, drain voltage=1V, source voltage=0V), because the gate voltage of 20V is applied to the gate electrode 9, a channel is formed in a surface of the p-type base region 3 which is in contact with the trench 6. For that reason, electrons implanted from the source electrode 11 reach the n⁻ type drift layer 2 after having passed through the channel formed from the n⁺ type source region 4 to the p-type base region 3. With the above configuration, a current can flow between the source electrode 11 and the drain electrode 12.

In the MOSFET with the above trench gate structure, although the p-type SiC layer 7 may become in the floating state, the p-type SiC layer 7 is formed in only the corners of the bottom of the trench 6. For that reason, the formation area is narrow as compared with the structure in which the p-type SiC layer 7 is formed on the overall bottom of the trench 6. For that reason, the deterioration of the switching characteristic is relatively low, and the deterioration of the switching characteristic can be suppressed. In particular, when the p-type SiC layer 13 is formed on the side surface of the trench 6 as will be described later, the p-type SiC layer 13 serves as a coupling layer, and the p-type SiC layer 7 becomes identical in potential with the p-type base region 3 through the p-type SiC layer 13. For that reason, the p-type SiC layer 7 can be restricted from being in the floating state, and the deterioration of the switching characteristic can be further suppressed.

Next, a method of manufacturing the MOSFET with the trench gate structure illustrated in FIG. 1 will be described with reference to FIG. 2.

Figure 2:
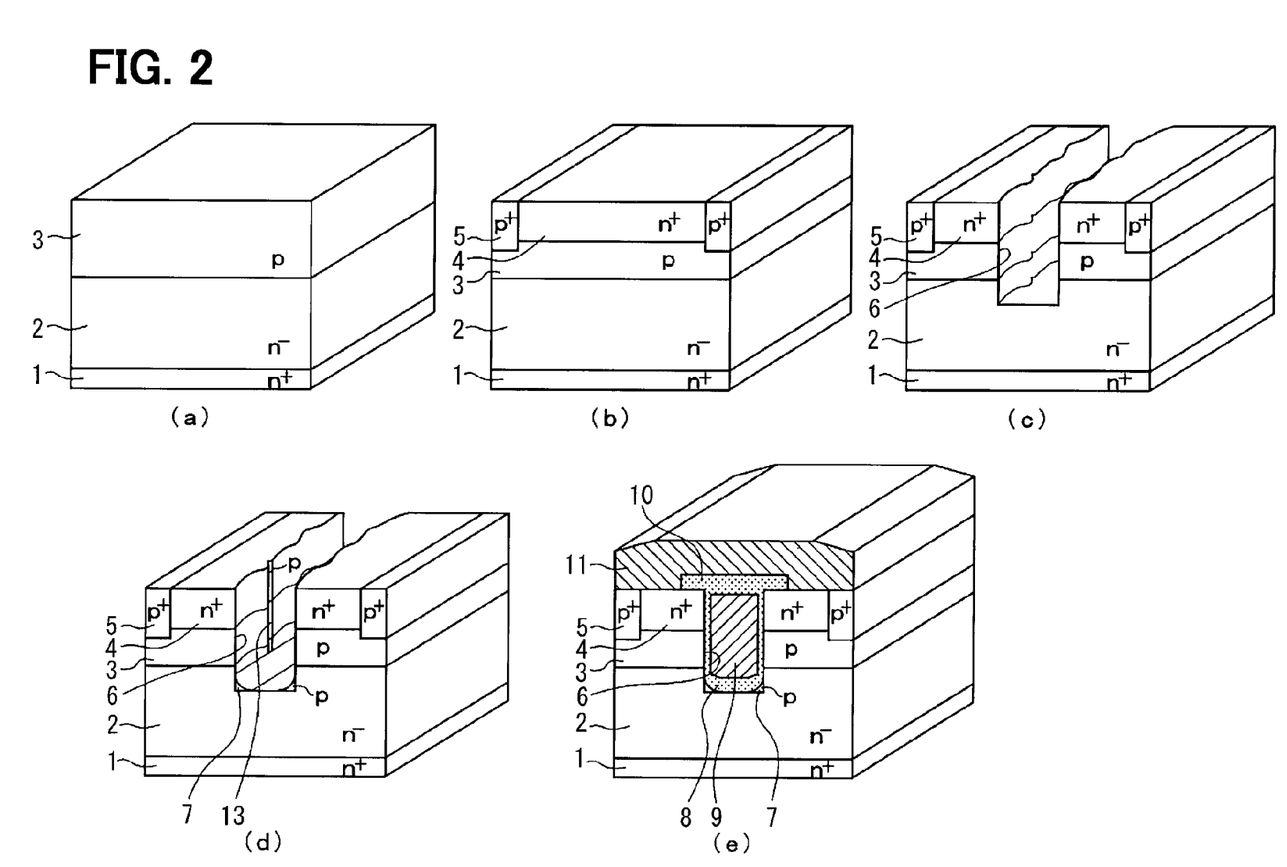

[Process Illustrated in (a) of FIG. 2]

First, an epitaxial substrate is prepared in which the n⁻ type drift layer 2 made of SiC which is, for example, $3.0\times10^{15}$ to $2.0\times10^{16}/cm^3$ in n-type impurity concentration of such as nitrogen, and about 15 μm in thickness epitaxially grows on the surface of the n⁺ type substrate 1, which is, for example, $1.0\times10^{19}/cm^3$ in n-type impurity concentration of such as nitrogen, and about 300 μm in thickness. Then, the p-type base region 3 that is for example, $1.0\times10^{16}$ to $2.0\times10^{19}/cm^3$ in p-type impurity concentration of such as boron or aluminum, and about 2.0 μm in thickness is formed on the surface layer portion of the n⁻ type drift layer 2 by ion implantation of an p-type impurity such as boron or aluminum.

[Process Illustrated in (b) of FIG. 2]

Subsequently, a mask (not shown) made of, for example, LTO is formed on the p-type base region 3, and thereafter the mask is opened in an area where the n⁺ type source region 4 is to be formed through a photolithography process. Thereafter, an n-type impurity (for example, nitrogen) is ion-implanted.

Further, after the mask used previously has been removed, another mask (not shown) is again formed, and the mask is opened in an area where the p⁺ type contact layer 5 is to be formed through the photolithography process. Thereafter, an p-type impurity (for example, boron or aluminum) is ion-implanted.

Then, with the activation of the implanted ions, the n⁺ type source region 4 that is for example, $1.0 \times 10^{21}/cm^3$ in n-type impurity concentration (surface concentration) of such as nitrogen and about 0.3 μm in thickness is formed, and the p⁺ type contact layers 5 that are, for example, $1.0 \times 10^{21}/cm^3$ in p-type impurity concentration (surface concentration) such as boron or aluminum, and about 0.3 μm in thickness, are formed. Thereafter, the mask is removed.

[Process Illustrated in (c) of FIG. 2]

After an etching mask not shown has been formed on the p-type base region 3, the n⁺ type source region 4, and the p⁺ type contact layer 5, the etching mask is opened in an area where the trench 6 is to be formed. Then, a trench etching process is conducted with the use of the etching mask to form the trench 6. Thereafter, the etching mask is removed.

[Process Illustrated in (d) of FIG. 2]

Hydrogen etching mixed with TMA (trimethyl aluminum) is conducted to remove damage of the trench etching. For example, the hydrogen etching is implemented through a heat treatment in a hydrogen atmosphere under decompression at 1600° C. or higher, such as a high-temperature hydrogen atmosphere of, for example, 1625° C. and $2.7 \times 10^4$ Pa (200 Torr) while being mixed with TMA, to conduct the damage removal of the trench etching for about five minutes. With the above process, the rounding process is conducted, and the corners of the opening of the trench 6, the corners of the bottom of the trench 6, and projected portions of the side surface of the trench 6 are rounded. Also, the etching gas in this situation again adheres to the inner wall surface of the trench 6, so the SiC layer 7 epitaxially grows. In the SiC layer 7, nitrogen remaining within a reactive furnace used when etching is taken as the n-type impurity. At the same time, aluminum contained in the TMA is taken as the p-type impurity. For that reason, whether the Sic layer 7 becomes of n-type or p-type is determined on the basis of the concentrations of nitrogen and aluminum.

On the basis of the above, in the present embodiment, the mixing amount of TMA is adjusted so that the concentration of aluminum, that is, the p-type impurity concentration becomes higher than the concentration of nitrogen, that is, the n-type impurity concentration. As a result, the SiC layer 7 is compensated to be converted to p-type. Specifically, since the n-type impurity concentration assumed that residual nitrogen is taken in the SiC layer 7 is $1 \times 10^{16}$ to $1 \times 10^{17}/cm^3$, the mixing amount of TMA is adjusted so that the p-type impurity concentration within the SiC layer 7 becomes $1 \times 10^{17}/cm^3$ or higher. With the above process, the p-type SiC layer 7 can be formed in the corners of the bottom of the trench 6 through the hydrogen etching.

Also, the SiC layer 13 may be formed on the side surface of the trench 6 due to unevenness of the side surface of the trench 6 formed at the time of trench etching even on the inner wall surface of the trench 6 through the heat treatment in the hydrogen etching. Because the SiC layer 13 is also formed in the similar manner to that of the p-type SiC layer 7, the SiC layer 13 becomes of p-type which is $1 \times 10^{17}/cm^3$ or higher in the p-type impurity concentration, as in the p-type SiC layer 7. When such a p-type SiC layer 13 is formed, the SiC layer 13 functions as the coupling portion, and the p-type SiC layer 7 is partially coupled with the p-type base region 3 by the SiC layer 13. As a result, the p-type SiC layer 7 does not become in the floating state, and is fixed to the same potential as that of the p-type base region 3. Further, because the SiC layer 13 becomes not n-type but p-type, there is no formation of the channel path that increases the drain leakage current.

As described above, in the hydrogen etching conducted in this process, the heat treatment is conducted at a high temperature of 1600° C. or higher. For that reason, the corners of the opening of the trench 6, the corners of the bottom of the trench 6, and the projected portions of the side surface of the trench 6 are effectively etched. With the above process, the p-type SiC layers 7 and 13 epitaxially grow in a recessed portions of the trench 6, that is, the corners of the bottom and recessed portions of the side surface. Also, the plane is flattened, and the corners are rounded. Because the unevenness of the side surface of the trench 6 is reduced, the channel mobility can be improved, and the gate insulating film 8 can be restricted from being thinned at the corners of the trench 6. The lifetime of the gate insulating film 8 can be improved, and the reliability can be improved.

Because the hydrogen etching is conducted at the above high temperature, the hydrogen etching can be implemented while serving as the activation annealing of the portions configured by ion implantation such as the n⁺ type source region 4 and the p⁺ type contact layer 5. With the above process, the activation annealing, that is, a process only for recovering the damage caused by the ion implantation can be omitted, and the manufacturing process can be simplified. Also, in this case, because there is no need to conducting the heat treatment before the trench etching, the unevenness of the side surface of the trench 6 which is caused by an influence of step bunching exposed at the time of the heat treatment can be reduced.

[Process Illustrated in (e) of FIG. 2]

The gate insulating film forming process is conducted by thermal oxidation, to thereby form the gate insulating film 8 on the overall surface of the substrate including the inside of the trench 6. Specifically, the gate insulating film 8 is formed by the gate oxidation (thermal oxidation) through a pyrogenic method in a wet atmosphere. Subsequently, a polysilicon layer doped with an n-type impurity is formed in about 440 nm on the surface of the gate insulating film 8, for example, at a temperature of 600° C., and thereafter an etch-back process or the like is conducted, to thereby leave the gate insulating film 8 and the gate electrode 9 within the trench 6.

Also, after the interlayer insulating film 10 has been formed, the interlayer insulating film 10 is patterned to form the contact holes connected to the n⁺ type source region 4 and the p⁺ type contact layer 5. Also, the contact hole connected to the gate electrode 9 is formed in another cross section. Subsequently, after an electrode material film is formed to be embedded within the contact holes, the electrode material is patterned to form the source electrode 11 and the gate wiring.

Thereafter, although not shown, the drain electrode 12 is formed on a rear surface side of the n+ type substrate 1 to complete the MOSFET illustrated in FIG. 1.

As described above, according to the SiC semiconductor device of the present embodiment, the p-type SiC layer 7 is formed in the corners of the bottom of the trench 6. For that reason, even if the electric field is applied between the drain and the gate when the MOSFET is off, the depletion layer in the pn junction between the p-type SiC layer 7 and the n− type drift layer 2 greatly extends toward the n− type drift layer 2. As a result, the high voltage caused by an influence of the drain voltage hardly enters the gate insulating film 8. With the above configuration, the electric field concentration within the gate insulating film 8, in particular, the electric field concentration in the bottom of the trench 6 in the gate insulating film 8 can be reduced, thereby being capable of restricting the gate insulating film 8 from being broken.

In the MOSFET with the above trench gate structure, although the p-type SiC layer 7 may become in the floating state, the p-type SiC layer 7 is formed in only the corners of the bottom of the trench 6. The formation area of the p-type SiC layer 7 is narrow as compared with the structure in which the p-type SiC layer 7 is formed on the overall bottom of the trench 6. For that reason, the deterioration of the switching characteristic is relatively low, and the deterioration of the switching characteristic can be suppressed. In particular, when the p-type SiC layer 13 is formed on the side surface of the trench 6, the p-type SiC layer 7 becomes identical in potential with the p-type base region 3 through the p-type SiC layer 13. For that reason, the p-type SiC layer 7 can be restricted from being in the floating state, and the deterioration of the switching characteristic can be further suppressed.

When the p-type SiC layer 13 is formed, there is a case where a threshold voltage of the MOSFET is reduced by an influence of the type SiC layer 13. For that reason, it is preferable that the p-type impurity concentration of the SiC layer 13 is set to be higher than the p-type impurity concentration of the p-type base region 3. With the above setting, such a problem that the threshold voltage is partially reduced to deteriorate a sub-shred characteristic and deteriorate an on/off current ratio can be restricted.

Second Embodiment

A second embodiment of the present disclosure will be described. In the present embodiment, the shape of the trench 6 in the first embodiment is changed. Other configurations are similar to those in the first embodiment, and therefore only parts different from those in the first embodiment will be described.

Figure 3:
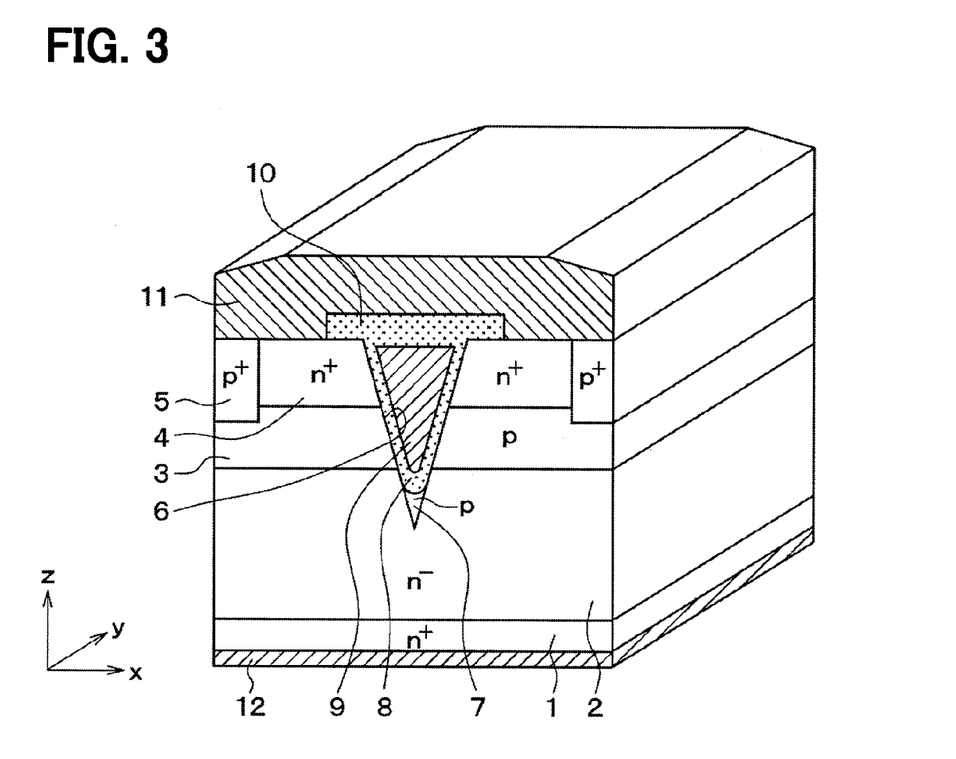
FIG. 3 is a perspective cross-sectional view illustrating one cell extracted from a MOSFET having a trench gate structure according to a second embodiment of the present disclosure.

As illustrated in FIG. 3, in the present embodiment, the trench 6 is formed into a triangular shape, that is, the bottom is formed into not a flat surface but a pointed taper shape. The p-type SiC layer 7 that is formed into a triangular round shape (triangular shape having a rounded side) in a cross section is formed in the corner of the bottom of the trench 6, such as in the tip end portion of the trench 6 in the case of the present embodiment. Even with the above structure, the existence of the p-type SiC layer 7 formed in the corner of the bottom of the trench 6 enables the electric field concentration on the bottom of the trench to be reduced when the MOSFET is off. As a result, the gate insulating film 8 can be restricted from being broken.

Also, even in the structure where the p-type SiC layer 7 is formed on the overall bottom of the trench 6, since the bottom per se of the trench 6 is formed into not the flat surface but the pointed shape, an area where the p-type SiC layer 7 is formed is narrow. For that reason, the deterioration of the switching characteristic is relatively low, and the deterioration of the switching characteristic can be suppressed.

Figure 4:
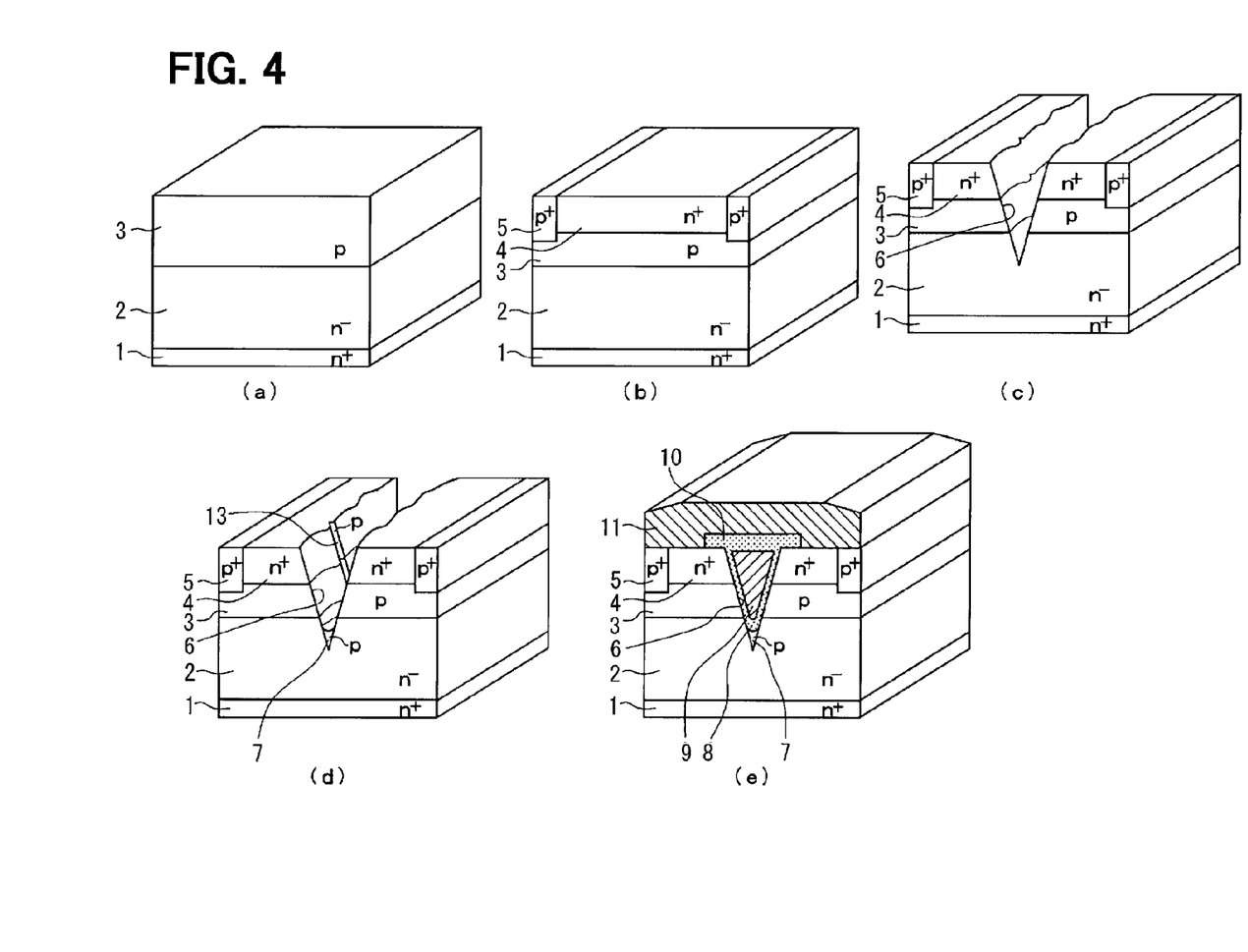

As illustrated in (a) to (e) of FIG. 4, a method of manufacturing the MOSFET according to the present embodiment is substantially similar to that of the MOSFET according to the first embodiment, but a trench etching condition when forming the trench 6 is changed. For example, the width of the trench 6 is narrowed, and a tip end of the trench 6 is pointed. Even in the above structure, as illustrated in (d) of FIG. 4, the p-type SiC layer 13 may be formed on the side surface of the trench 6. With the formation of the p-type SiC layer 13, because the p-type SiC layer 7 is not in the floating state, the deterioration of the switching characteristic can be further suppressed.

Other Embodiments

In the above respective embodiments, for the purpose of forming the p-type SiC layers 7 and 13, TMA is mixed as the p-type dopant gas at the time of hydrogen etching. Alternatively, another p-type dopant gas may be mixed. For example, $B_2H_6$ (diborane) may be used as the p-type dopant gas. When the TMA is used, the TMA is easily treated because of no poison gas. Although a vapor pressure is low, if the concentration is low, gas in which hydrogen and the TMA are mixed together can be used. On the contrary, when $B_2H_6$ is used, because $B_2H_6$ is gas at room temperature, a bubbling device generally used when the TMA is used is unnecessary. The p-type dopant gas may be appropriately selected depending on which of the above advantages is prioritized, or which of boron and aluminum is used as the p-type impurity.

Also, in the above respective embodiments, the p-type impurity is ion-implanted into the surface layer portion of the n− type drift layer 2 to form the p-type base region 3, and the n-type impurity is ion-implanted into the surface layer portion of the p-type base region 3 to form the n+ type source region 4. On the contrary, the p-type base region 3 may be formed on the surface of the n− type drift layer 2 by epitaxial growth, or the n+ type source region 4 may be formed on the surface of the p-type base region 3 by epitaxial growth. Alternatively, a triple epitaxial substrate in which the n− type drift layer 2, the p-type base region 3, and the n+ type source region 4 epitaxially grow on the surface of the n+ type substrate 1 may be used from the start as the semiconductor substrate.

Also, in the above respective embodiments, the MOSFET of the n-channel type in which the first conductivity type is n-type, and the second conductivity type is p-type has been described as an example. Alternatively, the present disclosure can be applied to the MOSFET of the p-channel type in which the conductivity type of the respective components is reversed. Also, in the above description, the MOSFET of the trench gate structure has been described as an example. The present disclosure can be applied to the IGBT having the same trench gate structure. in the IGBT, only the conductivity type of the substrate 1 is changed from the n-type to the p-type with respect to the above respective embodiments, and other structures and the manufacturing method are similar to those in the above respective embodiments.

Also, in the above respective embodiments, examples to which the present disclosure is applied have been described. However, a design can be appropriately changed. For example, in the above respective embodiments, the oxide film by thermal oxidation exemplifies the gate insulating film 8. Alternatively, an oxide film or a nitride film not depending on the thermal oxidation may be included in the gate insulating film 8. Also, the process of forming the drain electrode 12 may be conducted before the formation of the source electrode 11.

The present disclosure has been described in conformity with the embodiments. However, it is understood that the present disclosure is not limited to the embodiments and the structures thereof. The present disclosure includes various modifications and modifications within an equivalent scope. In addition, various combinations and configurations as well as other combinations and configurations including only one element, more than one element, or less than one element also fall within the scope of the present disclosure and the conceptual scope.

The invention claimed is:

1. A silicon carbide semiconductor device comprising:
    a silicon carbide substrate that is of either a first conductivity type, or a second conductivity type that is opposite the first conductivity type;
    a drift layer that is disposed on the substrate, and made of a first conductivity type silicon carbide lower in impurity concentration than the substrate;
    a base region that is disposed on the drift layer, and made of a second conductivity type silicon carbide;
    a source region that is disposed on the base region, and made of a first conductivity type silicon carbide higher in impurity concentration than the drift layer;
    a contact region that is connected to the base region, and made of a second conductivity type silicon carbide higher in impurity concentration than the base region;
    a trench that extends to a position deeper than the base region from a surface of the source region;
    a second conductivity type layer that is disposed in a bottom of the trench, and is made of a second conductivity type silicon carbide;
    a gate insulating film that is disposed on an inner wall surface of the trench on the second conductivity type layer;
    a gate electrode that is disposed on the gate insulating film within the trench;
    a source electrode that is electrically connected to the base region through the source region and the contact region; and
    a drain electrode that is disposed on a rear side of the substrate,
    wherein the silicon carbide semiconductor device has an inversion type semiconductor switching element with a trench gate structure that forms an inversion type channel region on a surface portion of the base region located on a side surface of the trench through control of an application voltage to the gate electrode, and allows a current to flow between the source electrode and the drain electrode through the source region and the drift layer;
    wherein the trench defines a longitudinal direction in one direction, and the bottom of the trench has a predetermined width;
    wherein the gate insulating film contacts a bottom surface of the trench;
    wherein the second conductivity type layer disposed in the bottom of the trench includes a first corner portion and a second corner portion;
    wherein the first corner portion and the second corner portion of the second conductivity type layer are disposed at opposite corners of the bottom of the trench and separated from each other by the gate insulating film, which contacts the bottom surface of the trench, in a width direction of the trench in a cross-section taken along a depth direction and the width direction of the trench; and
    wherein each of the first corner portion and the second corner portion has a triangular round shape in the cross-section taken along the depth direction and the width direction of the trench, the triangular round shape being defined by two sides that contact the side surface of the trench and the bottom surface of the trench and one side that contacts the gate insulating film.

2. The silicon carbide semiconductor device according to claim 1, wherein
    at least a part of the side surface of the trench is provided with a coupling layer made of a second conductivity type silicon carbide, and
    the base region and the second conductivity type layer are coupled with each other by the coupling layer.

3. The silicon carbide semiconductor device according to claim 2, wherein
    an impurity concentration of the second conductivity type layer, which is $1\times10^{17}/cm^3$ or higher, and an impurity concentration of the coupling layer are the same.

4. The silicon carbide semiconductor device according to claim 2, wherein
    the impurity concentration of the coupling layer is higher than an impurity concentration of the base region.

5. A method of manufacturing the silicon carbide semiconductor device according to claim 1, comprising:
    forming the trench to a position deeper than the base region from the surface of the source region; and
    after the forming of the trench, conducting a heat treatment under a hydraulic atmosphere mixed with a second conductivity type dopant gas to subject the inner wall surface of the trench to hydrogen etching, and to form the second conductivity type layer in the corner of the bottom of the trench by epitaxial growth taking the second conductivity type dopant gas.

6. The method of manufacturing the silicon carbide semiconductor device according to claim 5, further comprising activation-annealing to activate an ion implantation layer including the contact layer, wherein
    the activation-annealing is conducted simultaneously by the heat treatment for conducting the hydrogen etching.

7. The method of manufacturing the silicon carbide semiconductor device according to claim 5, wherein
    a TMA is used as the second conductivity type dopant gas.

8. The method of manufacturing the silicon carbide semiconductor device according to claim 5, wherein
    a $B_2H_6$ is used as the second conductivity type dopant gas.

9. The silicon carbide semiconductor device according to claim 1, wherein
    the triangular round shape is a triangular shape having two straight sides and one round side.

10. The silicon carbide semiconductor device according to claim 1, wherein
    the two sides that define the triangular round shape and contact the side surface and the bottom surface of the trench are straight, and
    the one side that defines the triangular round shape and contacts the gate insulating film is rounded.

* * * * *